United States Patent [19]

Sidman et al.

[11] Patent Number: 4,935,929
[45] Date of Patent: Jun. 19, 1990

[54] DIAGNOSTIC CIRCIUT FOR DIGITAL SYSTEMS

[75] Inventors: Steven B. Sidman, Campbell; Philip Freidin, Sunnyvale, both of Calif.

[73] Assignee: Advanced Micro Devices, Inc., Sunnyvale, Calif.

[21] Appl. No.: 181,626

[22] Filed: Apr. 14, 1988

[51] Int. Cl.$^5$ ............................................. G06F 11/00
[52] U.S. Cl. ................................. 371/22.3; 371/25.1
[58] Field of Search ................... 371/25, 27, 21, 21.1, 371/21.2, 21.4, 21.3, 21.5, 21.6, 25.1, 22.3, 22.1, 22.4, 27; 364/200, 900

[56] References Cited

U.S. PATENT DOCUMENTS

| | | | |
|---|---|---|---|
| 4,476,431 | 10/1984 | Blum | 371/25 |
| 4,580,137 | 4/1986 | Fiedler | 371/25 |
| 4,669,061 | 5/1987 | Bhavsar | 371/25 |
| 4,697,267 | 9/1987 | Wakai | 371/25 |
| 4,698,588 | 10/1987 | Hwang | 371/25 |

Primary Examiner—Michael R. Fleming
Attorney, Agent, or Firm—Fliesler, Dubb, Meyer & Lovejoy

[57] ABSTRACT

In a circuit for selectively communicating data into and out of a signal path, typically used for diagnosing a data processing unit, a shadow register is used for receiving data from and transferring data to an external source. The shadow register is physically insulated from the signal path by a first state register and a second state register, the first state register transferring data from the signal path to the shadow register, the second state register transferring data between the shadow register and the signal path. Path switching is achieved by a selector connected to the respective outputs of the first and second state registers and responsive to a control signal for releasing output signals from only one of these registers.

13 Claims, 3 Drawing Sheets

've
DIAGNOSTIC CIRCIUT FOR DIGITAL SYSTEMS

FIELD OF THE INVENTION

This invention relates generally to a circuit for communicating data into and out of a signal path in a digital system. Since one particular use of this circuit is for diagnosing faults in digital systems, and more particularly, for diagnosing faults using the serial scan techniques, therefore, this invention also relates to a diagnostic circuit.

BACKGROUND OF THE INVENTION

A common technique of diagnosing a digital system is by introducing known data patterns into the system and sampling for expected modifications, by the system, of the data patterns at desired nodes. This technique is usually effective in diagnosing a combinational circuit since it involves no memory of preceding states. However, the technique is not as effective in diagnosing a sequential circuit because data at each node is usually dependent upon both the system's current state and its input, so that if a circuit failure causes unexpected state transitions, the sampled result may be so contaminated by having travelled through a wrong system path that analysis of the sampled result most frequently becomes impossible.

In U.S. Pat. No. 4,476,560, which has the same assignee as the present invention, there is disclosed a technique for solving the above identified diagnostic difficulty of a sequential circuit. By providing a circuit that breaks a signal path, with the capability to introduce and remove data signals into and from the signal path, a sequential circuit can then be diagnosed as a plurality of combinatorial circuits.

The block diagram of a prior art part '818 diagnostic register circuit is given in FIG. 1. The circuit has a shadow register interfacing with an external device. The shadow register is insulated from the signal path by an output register. This insulation is provided to prevent possible damages to the system which may occur when the diagnostic data is being input into the shadow register. The insulation also prevents the shadow register from interfering with the normal operation of the system during the introduction of diagnostic data into the shadow register.

In prior art diagnostic register circuits, signal path switching is performed by a multiplexer connected to the input of the output register. The multiplexer performs signal path switching by selectively switching the input of the output register. A major problem associated with the prior art configurations has been the delay of signal propagation caused by the multiplexer logic. Therefore, there is a need for a circuit whereby the multiplexer can be eliminated. It is also desirable to have a circuit whereby operational and functional compatibility with the '818 part device can be preserved.

SUMMARY OF THE INVENTION

Accordingly, the present invention comprises a circuit for selectively communicating data into and out of a signal path. The circuit comprises: first data storage means having input means coupled to said signal path which is responsive to a control signal for storing signals from said signal path; second data storage means having first input means and second input means, and responsive to a control signal for selectively storing signals from said first input means and second input means; and selector means coupled to said first data storage means and said second data storage means, and responsive to a control signal for selectively releasing signals from said first data storage means and second storage means; said first input means of said second storage means being coupled to receive signals released from said selector means, said second input means of said second storage means being coupled to received data from an external source, said data storage means having means for outputting stored signals to an external device.

DETAILED DESCRIPTION

Figure 1:
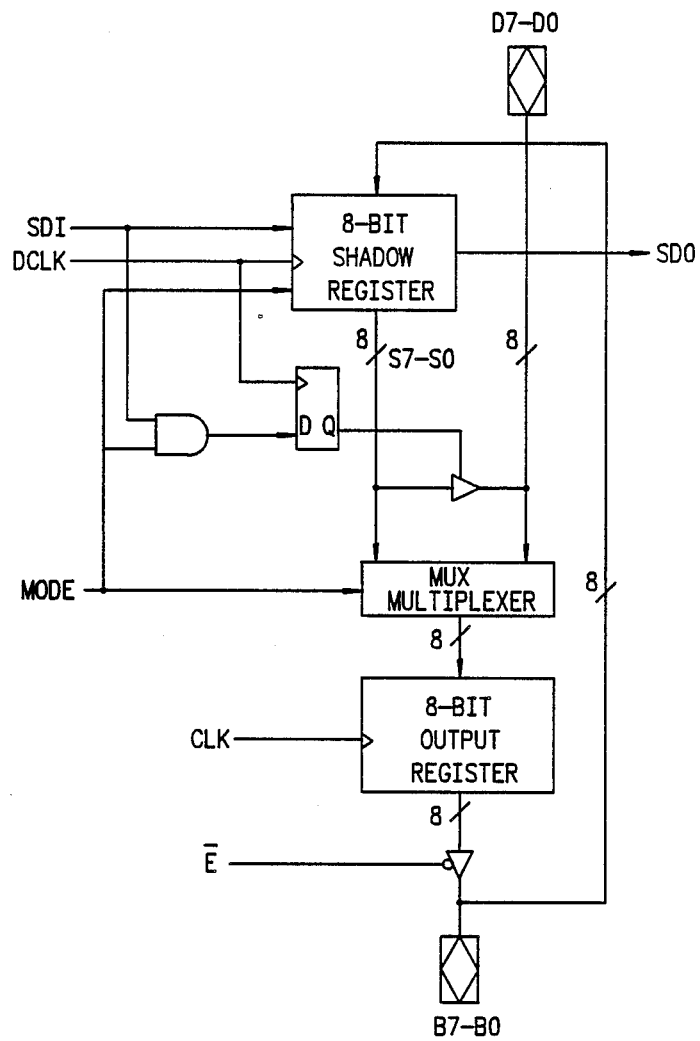
FIG. 1 is a block diagram of the prior art '818 diagnostic register.
Figure 2:
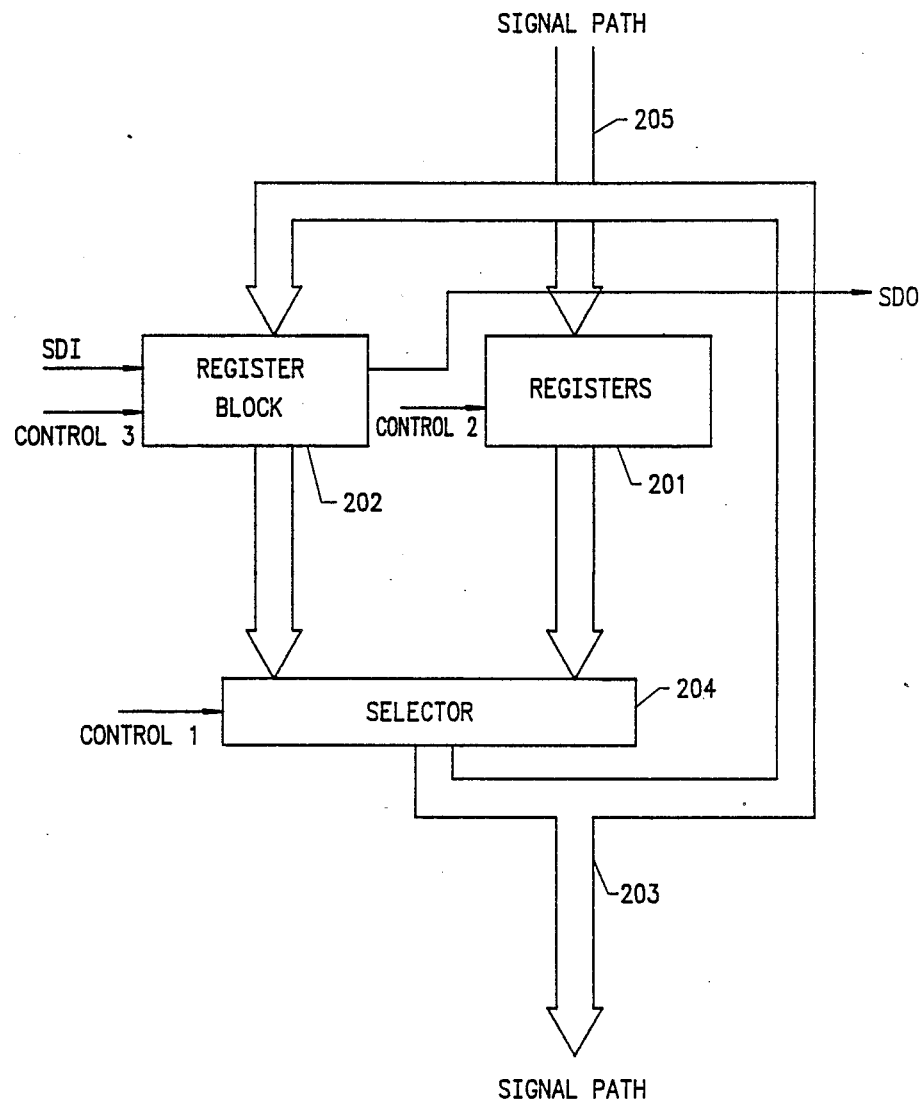
FIG. 2 is a block diagram of the circuit according to the present invention.

FIG. 2 is a block diagram illustrating the signal introduction and removal circuit according to the present invention. In the circuit is a register 201 connected to receive signals of signal path at 205. When enabled by control signal 2, signals received by register 201 will be stored and appear at its output.

Register block 202 provides an interface to an external device (not shown). According to a preferred implementation of this invention, register block 202 has a shift/storage register which includes parallel input/output means and serial input/output means. The serial input is used for receiving signals from the external source. The received signals from the external source will be output to the signal path via its parallel output. The parallel input is used for receiving signals from the signal path at point 203. The received signals will be output to the external source via its serial output.

The parallel output of register 201 and the parallel output of register block 202 are connected to respective inputs of a selector 204 whereby the output of one of these registers will be released as the output of selector 204. The output of selector 204 is connected to the signal path at point 203, which in turn is connected to the parallel input of register block 202.

In normal operation, signals from the signal path enter register 201 at 205, and reenter the signal path at point 203 by way of the selector 204. To introduce external signals into the signal path, the external signals are first shifted into the shift register of register block 202. The signals will then enter the signal path by way of the parallel output of register block 202 and the selector 204. To sample the signal path, signals from the signal path are loaded into register 201, received by the parallel input of the shift register of register block 202 by way of the selector 204, and then shifted out of register block 202 to the external source.

Figure 3:
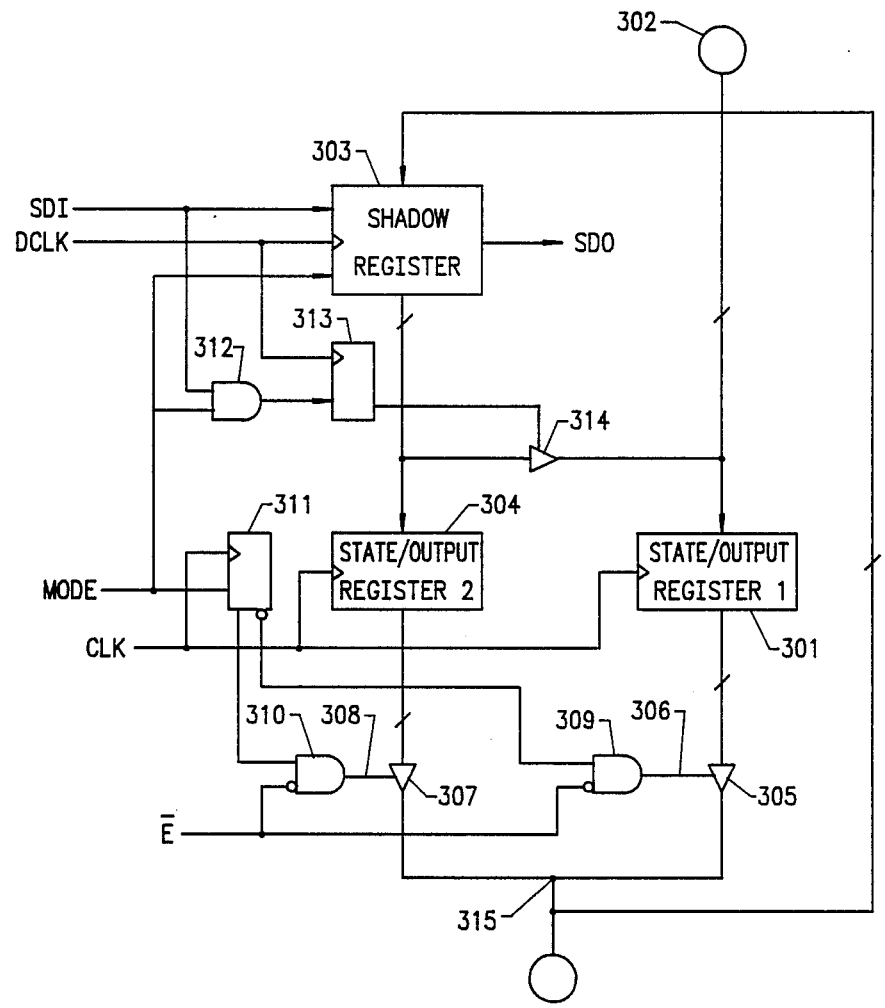
FIG. 3 is a schematic diagram of a preferred implementation of the present invention.

Referring to FIG. 3, there is shown a preferred embodiment of the present invention implemented to operate with functional and operational compatibility as the '818 part device.

State/output register 301 is a parallel input/output register connected to receive signals from the signal path at point 302. The signals will be stored and appear at the parallel output of register 301 with the activation of a clock (CLK) signal.

The shadow register 303, according to the preferred embodiment of this invention, is a shift register having parallel input/output and serial input/output. The serial input of the shadow register 303 is used for receiving diagnostic data from an external source (not shown). The parallel output of the shadow register 303 is used for introducing diagnostic data into the signal path. The shadow register 303 receives signals from signal path through its parallel input. The received signals will be transferred to an external source (not shown) through the serial output of shadow register 303.

To maintain compatibility with the '818 part device, the parallel output of the shadow register 303 is first received and stored in state/output register 304. The output of register 304 is connected to a set of tri-state buffers 307 whereby the output of register 304 will be released or blocked in response to control signal 308. The released signals enter the signal path at point 315.

Similarly, the output of register 301 is connected to another set of tri-state buffers 305 which, responsive to a control signal 306, releases or blocks the output of register 301 to the signal path at point 315.

Control signal 306 to tri-state buffers 305 comes from the output of AND gate 309. Control signal 308 of tri-state buffers 307 comes from the outpt of AND gate 310. Each of AND gates 309 and 310 has one input terminal connected to receive an enable signal $\overline{E}$. A second input of AND gate 309 is connected to one output of flip-flop 311. A second input of AND gate 310 is connected to the complementary output of flip-flop 311. In this way when one set of the tri-state buffers is enabled to release signals to the signal path, the other set of tri-state buffers would have high impedance, blocking the corresponding signals to the signal path.

Input to flip-flop 311 is an externally generated control mode signal (MODE). This MODE signal is clocked into the flip flop 311 by the same CLK signal used to enable the loading of register 301 and register 304.

Point 315 of the signal path, which is connected to the output of both tri-state buffers 305 and 307, is connected to the parallel input of shadow register 303. With the application of proper control signals, signals at point 315 will be received and stored in the shadow register 303. Signals stored in the shadow register 303 are shifted out through its serial output to an external source.

The operation of the circuit is now described. When clock signal (CLK) is active, output from shadow register 303 is loaded into state/output register 304, signals from the signal path 302 are loaded into state/output register 301, and control mode signal (MODE) is loaded into flip flop 311.

When the mode control signal (MODE) is "low", AND gate 309 will be enabled. Subject to the level of enable signal $\overline{E}$, the content of register 301 will be released by tri-state buffers 305 into the signal path at point 315. On the other hand, AND gate 310 will be disabled, and thus regardless of the level of enable signal, $\overline{E}$, the signal path will be insulated from the output of register 304.

When the control mode signal (MODE) is "low", input to the serial input of the shadow register 303 will be clocked into the shadow register 303 by the diagnostic clock (DCLK). The above described operations are summarized in the first three rows of table 1.

When a "high" control mode (MODE) signal is clocked into flip-flop 311, AND gate 309 will be disabled regardless of the enabled signal $\overline{E}$. Thus tri-state buffers 305 will have high impedance and insulating the signal path from the output of register 301. On the other hand, a "high" control mode signal (MODE) will enable AND gate 310 and, when enable signal $\overline{E}$ is active, tri-state buffers 307 will release the output of register 304 into point 315 of the signal path.

When the control mode (MODE) is "high" and the serial data input (SDI) is "low", signals at the parallel input of shadow register 303 will be clocked by the diagnostic clock (DCLK) into shadow register 303.

If the control mode signal (MODE) is "high", and the serial data input signal (SDI) is "low", and if both the clock signal and the diagnostic clock signal (DCLK) are both active, the output of register 304 will be transferred to point 315 which, in turn, will be loaded into shadow register 303. On the other hand, the output of the shadow register 303 will be loaded into register 304. Effectively, contents of shadow register 303 and register 304 will be swapped.

If the control mode signal (MODE) is "high" and the serial data input signal (SDI) is "low", and if only the diagnostic clock (DCLK) is active, then only the shadow register will be loaded with signals from the signal path.

When both the control mode signal (MODE) and the serial data input signal (SDI) are "high", output of AND gate 312, which is connected to the input of flip flop 313, will be "high". With the diagnostic clock signal (DCLK) active, the output of AND gate 313 will be loaded into flip flop 312.

A "high" signal on the output of flip-flop 313 will cause the tri-state buffers 314 to connect the output of shadow register 303 to the signal path at point 302. As a result, a path is provided from the parallel output of the shadow register 303 to point 302. This path is most frequently used for writeable control store loading.

In the above described preferred implementation, two state registers, 301 and 304, are used to replace the output register of the '818 part device. Instead of selecting signal input to the output register as in the '818 part device, the above described implementation uses a state register to hold signals from each signal path, and then control the path selection by enabling the output of the desired state register. In this way, the state register in the parallel data path will have a set up time that is dependent only upon the register itself, and not on the propagation delay of the intervening multiplexer logic.

While the invention has been particularly shown and described with reference to the referred embodiment, it would be understood by those skilled in the art that changes in form in details could be made therein without departing from the spirit of the invention.

TABLE 1

| | | INPUTS | | | OUTPUTS | | | |
|---|---|---|---|---|---|---|---|---|
| | MODE | SDI | CLK | DCLK | B7-B0 | S7-S0 | SDO | OPERATION |
| 1 | L | X | | * | Bn → Dn | HOLD<br>Sn → Sn-1 | S7 | Load output register from input bus<br>Shift shadow |

TABLE 1-continued

| | INPUTS | | | OUTPUTS | | | |
|---|---|---|---|---|---|---|---|
| MODE | SDI | CLK | DCLK | B7-B0 | S7-S0 | SDO | OPERATION |
| 2 | L | X | * | HOLD | S0 → SD1 | S7 | register data Load output register from input bus while shifting shadow |
| 3 | L | X | | Bn → Dn | Sn → Sn-1 S0 → SD1 | S7 | register data Load output register |
| 4 | H | X | * | Bn → Sn | HOLD | SDI | from shadow register Load shadow register |
| 5 | H | L | * | HOLD | Sn → Bn | SDI | from output bus Swap shadow register |
| 6 | H | L | | Bn → Sn | Sn → Bn | SDI | and output register Enable D7-D0 outputs for writeable control |
| 7 | H | H | * | HOLD | HOLD | SDI | store loading |

*Clock must be steady or falling low to high transition

What is claimed is:

1. A circuit which is insertable between a first and a second point in a signal path for selectively transferring data to and from said signal path comprising:
   first data storage means;
   second data storage means;
   selector means;
   means for transferring data from said first point in said signal path to said second point in said signal path via said first data storage means and said selector means;
   means for transferring data from said first point in said signal path to an external data receiving device via said first data storage means, said selector means and said second data storage means; and
   means for transferrng data from an external source of data to said second point in said signal path via said second data storage means and said selector means.

2. A circuit as in claim 1, wherein said selector means comprises:
   first tri-state buffer means coupled to said first data storage means for receiving signals from said first data storage means and responsive to a first enable signal for selectively blocking and releasing said signals received; and
   second tri-state buffer means receiving signals from said second data storage means and responsive to a second enable signal for selectively blocking and releasing said signals received.

3. A circuit as in claim 2, wherein said first enable signal has a predefined logical relationship with respect to said second enable signal.

4. A circuit as in claim 3, wherein said first enable signal is a logical complement of said second enable signal.

5. A circuit which is insertable between a first and a second point in a signal path for selectively transferring data to and from said signal path comprising:
   first data storage means having an input and an output;
   second data storage means having an input and an output;
   third data storage means having a parallel data input and output and a serial data input and output;
   first means for transferring data from said first point in said signal path to said first data storage means;
   second means for transferring data from said first data storage means to said second point in said signal path and said parallel input of said second data storage means;
   third means for transferring data from an external source of data to said serial input of said third data storage means;
   fourth means for transferring data from said serial output of said third data storage means to an external device;
   fifth means for transferring data from said parallel output of said third data storage means to said parallel inputs of said first and said second data storage means; and
   sixth means for transferring data from said output of said second data storage means to said second point in said signal path and said parallel input of said third data storage means.

6. A circuit according to claim 5 wherein said means for transferring data from said first and said second data storage means comprises:
   first and second tri-state buffer means coupled to said outputs of said first and said second data storage means respectively;
   first and second AND gate means coupled to said first and said second tri-state buffer means for controlling said tri-state buffer means; and
   first flip-flop means responsive to first control signals having complementary outputs coupled to said first and second AND gate means for selectively enabling said AND gate means; and
   wherein said means for transferring data from said third data storage means to said first data storage means comprises:
   third tri-state buffer means coupled between said parallel output of said third data storage means and said input of said first data storage means;
   second flip-flop means coupled to said third tri-state buffer means for controlling said third tri-state buffer means; and
   third AND gate means responsive to control signals for selectively setting said second flip-flop means to a predetermined logical state.

7. A circuit which is insertable between a first and a second point in a signal path for selectively transferring data into and out of said signal path comprising:
   first data storage means having an input and an output;
   second data storage means having a parallel input and output and a serial input and output;
   selector means having a first and a second input and an output;
   means for coupling said input of said first data storage means to said first point in said signal path and said output of said first data storage means to said first input of said selector means;

means for coupling said output of said selector means to said parallel input of said second data storage means and to said second point in said signal path;

means for coupling said serial input of said second data storage means to a source of external data;

means for coupling said parallel output of said second data storage means to said second input of said selector means; and means for coupling said serial output of said second data storage means to an external device for receiving data, said first data storage means including means responsive to control signals for storing data from said first point in said signal path in said first data storage means and for transferring data from said first data storage means to said first input of said selector means, said second data storage means including means responsive to control signals for selectively storing data from said parallel and serial inputs of said second data storage means and for selectively transferring data from said second data storage means via said parallel output thereof to said second input of said selector means and via said serial output thereof to said external device for receiving data, and said selector means including means responsive to control signals for selectively transferring data from said first and said second inputs thereof to said output thereof and said second point in said signal path.

8. A circuit which is insertable between a first and a second point in a signal path for selectively transferring data into and out of said signal path comprising:

first data storage means havng a parallel data input and output;

second data storage means having a parallel data input and output;

third data storage means having a parallel data input and output and a serial data input and output;

first, second and third AND gate means, each of said AND gate means having a first and second input and an output;

first, second and third tri-state buffer means, each of said buffer means having a data input, a data output and a control signal input;

first and second flip-flop means, said first flip-flop means having a data input, a clock input and an output and said second flip-flop means having a data input, a clock input and first and second complementary outputs;

means for coupling said input and said output of said first data storage means to said first point in said signal path and an input of said first tri-state buffer means, respectively;

means for coupling said parallel input of said third data storage means to said second point in said signal path and said parallel output of said third data storage means to said parallel input of said second data storage means and said data input of said third tri-state buffer means;

means for coupling said data output of said third tri-state buffer means to said first point in said signal path and said parallel input of said first data storage means;

means for coupling said parallel output of said second data storage means to said data input of said second tri-state buffer means;

means for coupling said data outputs of said first and said second tri-state buffer means to said second point in said signal path;

means for coupling said serial input and said serial output of said third data storage means to an external source of serial input data SDI and to an external device for receiving serial output data SDO, respectively;

means for coupling said third data storage means to a source of a data clock signal DCLK and to a source of a mode control signal MODE;

means for coupling said first and second input and said output of said third AND gate means to said source of serial input data SDI, said source of a mode control signal MODE and said data input of said first flip-flop means, respectively;

means for coupling said clock input and said output of said first flip-flop means to said source of data clock signal DCLK and said control signal input of said third tri-state buffer means, respectively;

means for coupling said first and said second data storage means to a source of clock signals CLK;

means for coupling said data input, said clock input, said first output and said second output of said second flip-flop means to said source of mode control signal MODE, said source of clock signals CLK and said first input of said first and said second AND gate means, respectively; and means for coupling said second inputs and said outputs of said first and second AND gate means to a source of enable signal $\overline{E}$ and said control signal input of said first and second tri-state buffer means, respectively.

9. A method for selectively transferring data to and from a signal path comprising the steps of:

providing a first data storage means;

providing a second data storage means;

providing a selector means;

transferring data from a first point in said signal path to a second point in said signal path via said first data storage means and said selector means;

transferring data from said first point in said signal path to an external data receiving device via said first data storage means, said selector means and said second data storage means; and transferring data from an external source of data to said second point in said signal path via said second data storage means and said selector means.

10. A method for selectively transferring data to and from a signal path comprising the steps of:

providing a first data storage means having an input and an output;

providing a second data storage means having an input and an output;

providing a third data storage means having a parallel data input and output and a serial data input and output;

selectively transferring data from a first point in said signal path to said first data storage means; selectively transferring data from said first data storage means to a second point in said signal path and said parallel input of said second data storage means;

selectively transferring data from an external source of data to said serial input of said third data storage means;

selectively transferring data from said serial output of said third data storage means to an external device;

selectively transferring data from said parallel output of said third data storage means to said parallel inputs of said first and said second data storage means; and selectively transferring data from said output of said second data storage means to said second point in said signal path and said parallel input of said third data storage means.

11. A method according to claim 10 wherein said step of selectively transferring data from said first and said second data storage means comprises the steps of:

providing a first and second tri-state buffer means coupled to said outputs of said first and said second data storage means respectively;

providing a first and second AND gate means coupled to said first and said second tri-state buffer means for controlling said tri-state buffer means; and providing a first flip-flop means responsive to first control signals having complementary outputs coupled to said first and second AND gate means for selectively enabling said AND gate means; and wherein said step of transferring data from said third data storage means to said first data storage means comprises the steps of:

providing a third tri-state buffer means coupled between said parallel output of said third data storage means and said input of said first data storage means;

providing a second flip-flop means coupled to said third tri-state buffer means for controlling said third tri-state buffer means; and providing a third AND gate means responsive to control signals for selectively setting said second flip-flop means to a predetermined logical state.

12. A method for selectively transferring data into and out of a signal path comprisng the steps of:

providing a first data storage means having an input and an output;

providing a second data storage means having a parallel input and output and a serial input and output;

providing a selector means having a first and a second input and an output;

coupling said input of said first data storage means to a first point in said signal path and said output of said first data storage means to said first input of said selector means;

coupling said output of said selector means to said parallel input of said second data storage means and to a second point in said signal path;

coupling said serial input of said second data storage means to a source of external data;

coupling said parallel output of said second data storage means to said second input of said selector means; and coupling said serial output of said second data storage means to an external device for receiving data;

selectively storing data from said first point in said signal path in said first data storage means;

selectively transferring data from said first data storage means to said first input of said selector means;

selectively storing data from said parallel and serial inputs of said second data storage means in said second data storage means;

selectively transferring data from said second data storage means via said parallel output thereof to said second input of said selector means and via said serial output thereof to said external device for receiving data; and selectively transferring data from said first and said second inputs of said selector means to said output thereof and said second point in said signal path.

13. A method for selectively transferring data into and out of a signal path comprising the steps of:

providing first data storage means having a parallel data input and output;

providing second data storage means having a parallel data input and output;

providing third data storage means having a parallel data input and output and a serial data input and output;

providing first, second and third AND gate means, each of said AND gate means having a first and second input and an output;

providing first, second and third tri-state buffer means, each of said buffer means having a data input, a data output and a control signal input;

providing first and second flip-flop means, said first flip-flop means having a data input, a clock input and an output and said second flip-flop means having a data input, a clock input and first and second complementary outputs;

coupling said input and said output of said first data storage means to a first point in said signal path and an input of said first tri-state buffer means, respectively;

coupling said parallel input of said third data storage means to a second point in said signal path and said parallel output of said third data storage means to said parallel input of said second data storage means and said data input of said third tri-state buffer means;

coupling said data output of said third tri-state buffer means to said first point in said signal path and said parallel input of said first data storage means;

coupling said parallel output of said second data storage means to said data input of said second tri-state buffer means;

coupling said data outputs of said first and said second tri-state buffer means to said second point in said signal path;

coupling said serial input and said serial output of said third data storage means to an external source of serial input data SDI and to an external device for receiving serial output data SDO, respectively;

coupling said third data storage means to a source of a data clock signal DCLK and to a source of a mode control signal MODE;

coupling said first and second input and said output of said third AND gate means to said source of serial input data SDI, said source of a mode control signal MODE and said data input of said first flip-flop means, respectively;

coupling said clock input and said output of said first flip-flop means to said source of data clock signal DCLK and said control signal input of said third tri-state buffer means, respectively;

coupling said first and said second data storage means to a source of clock signals CLK;

coupling said data input, said clock input, said first output and said second output of said second flip-flop means to said source of mode control signal MODE, said source of clock signals CLK and said first input of said first and said second AND gate means, respectively; and coupling said second inputs and said outputs of said first and second AND gate means to a source of enable signal $\overline{E}$ and said control signal input of said first and second tri-state buffer means, respectively.

* * * * *